(12) United States Patent
Hwang et al.

(10) Patent No.: US 11,942,472 B2
(45) Date of Patent: Mar. 26, 2024

(54) HIGH-VOLTAGE ELECTROSTATIC DISCHARGE DEVICES

(71) Applicant: GLOBALFOUNDRIES Singapore Pte. Ltd., Singapore (SG)

(72) Inventors: Kyong Jin Hwang, Singapore (SG); Milova Paul, Singapore (SG); Sagar Premnath Karalkar, Singapore (SG); Robert J. Gauthier, Jr., Williston, VT (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 120 days.

(21) Appl. No.: 17/475,942

(22) Filed: Sep. 15, 2021

(65) Prior Publication Data
US 2023/0078157 A1 Mar. 16, 2023

(51) Int. Cl.
*H01L 27/02* (2006.01)
*H01L 21/8222* (2006.01)

(52) U.S. Cl.
CPC ...... *H01L 27/0262* (2013.01); *H01L 21/8222* (2013.01); *H01L 27/0288* (2013.01)

(58) Field of Classification Search
CPC ........... H01L 21/74; H01L 2924/13024; H01L 2924/13034–13035; H01L 29/66121; H01L 27/0248–0262
See application file for complete search history.

(56) References Cited

U.S. PATENT DOCUMENTS

| | | | |
|---|---|---|---|
| 5,516,709 A * | 5/1996 | Yamazaki | H01L 21/8249 257/E21.375 |
| 5,998,854 A | 12/1999 | Morishita et al. | |
| 6,960,792 B1 | 11/2005 | Nguyen | |
| 7,910,951 B2 | 3/2011 | Vashchenko | |
| 8,049,247 B2 | 11/2011 | Tseng et al. | |
| 8,129,788 B1 | 3/2012 | Walker et al. | |
| 8,994,068 B2 | 3/2015 | Zhan et al. | |
| 9,431,389 B2 | 8/2016 | Hwang et al. | |
| 9,825,020 B2 | 11/2017 | Besse et al. | |
| 10,170,907 B2 | 1/2019 | Lai | |
| 10,361,185 B2 | 7/2019 | Zhan et al. | |

(Continued)

FOREIGN PATENT DOCUMENTS

| | | |
|---|---|---|
| TW | 200644212 | 12/2006 |
| TW | 201340286 | 10/2013 |
| TW | 201539745 | 10/2015 |

OTHER PUBLICATIONS

Chen et al., "Optimization on MOS-Triggered SCR Structures for On-Chip ESD Protection", IEEE Transactions on Electron Devices, vol. 56, No. 7, Jul. 2009, 7 pages.

(Continued)

*Primary Examiner* — Wasiul Haider
(74) *Attorney, Agent, or Firm* — Andrew M. Calderon; Calderon Safran & Cole, P.C.

(57) ABSTRACT

The present disclosure relates to semiconductor structures and, more particularly, to high-voltage electrostatic discharge (ESD) devices and methods of manufacture. The structure includes a vertical silicon-controlled rectifier (SCR) connecting to an anode, and includes a buried layer of a first dopant type in electrical contact with an underlying buried layer a second dopant type split with an isolation region of the first dopant type within a substrate.

20 Claims, 8 Drawing Sheets

(56) References Cited

U.S. PATENT DOCUMENTS

| | | |
|---|---|---|
| 2004/0129983 A1 | 7/2004 | Mallikarjunaswamy |
| 2005/0167753 A1 | 8/2005 | Mallikarjunaswamy et al. |
| 2014/0061740 A1 | 3/2014 | Ho |
| 2015/0028385 A1 | 1/2015 | Miyoshi et al. |
| 2015/0325570 A1 | 11/2015 | Chen et al. |
| 2016/0155737 A1 | 6/2016 | Linewih |
| 2017/0194314 A1 | 7/2017 | Lee et al. |
| 2018/0247925 A1 | 8/2018 | Salman et al. |
| 2019/0051646 A1 | 2/2019 | Salcedo et al. |
| 2019/0312026 A1* | 10/2019 | Zhan ............... H02H 9/046 |
| 2020/0266303 A1 | 8/2020 | Sai |
| 2022/0223584 A1 | 7/2022 | Appaswamy |
| 2023/0039286 A1 | 2/2023 | Hwang |
| 2023/0078157 A1 | 3/2023 | Hwang |
| 2023/0121127 A1 | 4/2023 | Hwang |

OTHER PUBLICATIONS

A. Ferrara et al., "The Boost Transistor: a Field Plate Controlled LDMOST", IEEE 27th International Symposium on Power Semiconductor Devices & IC's (ISPSD), 2015, 4 pages.

C. Duvvury et al., "Device Integration for ESD Robustness of High Voltage Power MOSFETs", Proceedings of 1994 EEE International Electron Devices Meeting, 1994, pp. 407-410, doi: 10.1109/IEDM.1994.383381, 4 pages.

Specification and drawings for U.S. Appl. No. 17/501,270, filed Oct. 14, 2021, 28 pages.

Jung et al., "A Design of BJT-based ESD Protection Device combining SCR for High Voltage Power Clamps", Journal of Semiconductor Technology and Science, vol. 14, No. 3, Jun. 2014, 6 pages.

Do et al., "A New Dual-Direction SCR With High Holding Voltage and Low Dynamic Resistance for 5 V Application", Journal of the Electorn Devices Society, IEEE, vol. 7, May 31, 2019, 5 pages.

Liu et al., "Novel Silicon-Controlled Rectifier (SCR) for High-Voltage Electrostatic Discharge (ESD) Applications", IEEE, vol. 29, No. 7, Jul. 2008, 3 pages.

Koo et al., "The design of high holding voltage SCR for Whole-chip ESD protection", IEICE Electronics Express, vol. 5, No. 17, Sep. 10, 2008, 7 pages.

Wang et al., "Novel High Holding Voltage SCR with Embedded Carrier Recombination Structure for Latch-up Immune and Robust ESD Protection", Nanoscale Research Letters, 2019, 7 pages.

Dai et al., "ESD Protection Design with Stacked High-Holding-Voltage, SCR for High Voltage Pins in a battery Monitoring IC", IEEE, vol. 63, No. 5, May 2016, 7 pages.

Koo et al., "Analysis of SCR-Based ESD Protection Circuit on Holding Voltage Characteristics", World Academy of Science, Engineering and Technology International Scholarly and Scientific Research & Innovation, vol. 8, No. 7, 2014, 4 pages.

Specification and drawings for U.S. Appl. No. 17/394,723, filed Aug. 5, 2021, 23 pages.

Jin-Woo Jung, et al., "A Design of BJT-based ESD Protection Device combining SCR for High Voltage Power Clamps", Journal of Semiconductor Technology and Science, vol. 14 Issue 3, 2014, 6 pages.

Chia-Tsen Dai, et al., "ESD Protection Design with Stacked High-Holding-Voltage, SCR for High Voltage Pins in a battery Monitoring IC", IEEE Electron Device Letter, vol. 63, No. 5, May 2016, 7 pages.

Specification and drawings for U.S. Appl. No. 18/308,322, filed Apr. 27, 2023, 24 pages.

Taiwanese Office Action in related TW Application No. 111134635 dated Jun. 13, 2023, 7 pages.

Office Action in related U.S. Appl. No. 17/394,723 dated Aug. 25, 2023, 9 pages.

Office Action in U.S. Appl. No. 17/501,270 dated Jul. 11, 2023, 13 pages.

Taiwanese Office Action in TW Application No. 1111125135 dated Oct. 19, 2023, 7 pages.

Final Office Action in U.S. Appl. No. 17/501,270 dated Nov. 22, 2023, 16 pages.

* cited by examiner

HIGH-VOLTAGE ELECTROSTATIC DISCHARGE DEVICES

FIELD OF THE INVENTION

The present disclosure relates to semiconductor structures and, more particularly, to high-voltage electrostatic discharge devices and methods of manufacture.

BACKGROUND

Electrostatic discharge (ESD) devices protect integrated circuits from the sudden flow of electricity caused by, for example, contact, electrical shorts or dielectric breakdown. ESD devices can thus protect integrated circuits from failure. ESD devices come in a variety of different structures such as resistors, fuses, etc.

ESD devices need to be in the ESD safe window with high current performance and high holding voltage (Vh) for high voltage applications. For example, the holding voltage needs to be higher than the operating voltage or the device will not turn off after turning on against ESD stress and discharge ESD stress during normal operation. In such a situation, the current will discharge, and the integrated circuit can become damaged.

Meeting both high current performance and high holding voltage for high voltage ESD demand is very challenging, though. For example, there is typically a tradeoff between high current performance and high holding voltage. That is, conventional devices typically provide either high current performance or high holding voltage. Illustratively, a high voltage PNP can provide a relatively high holding voltage control but not a high current performance, whereas a low voltage/high voltage silicon-controlled rectifier (SCR) can provide relatively high current performance but not a high holding voltage control.

SUMMARY

In an aspect of the disclosure, a structure comprises a vertical silicon-controlled rectifier (SCR) connecting to an anode, and comprising a buried layer of a first dopant type in electrical contact with an underlying buried layer comprising a second dopant type split with an isolation region of the first dopant type within a substrate.

In an aspect of the disclosure, a structure comprises a vertical NPN in a substrate and connected to a cathode, the vertical NPN comprising a buried layer of a first dopant type connected to an isolation region of a different dopant type, a base of a second dopant type and an emitter of the first dopant type.

In an aspect of the disclosure, a method comprises forming a vertical silicon-controlled rectifier (SCR) in a substrate and connecting to an anode. The forming of the vertical SCR comprises: forming a buried layer in a substrate, the buried layer comprising forming a first dopant type layer and an isolation region of a second dopant type that splits the first dopant type layer; forming a buried layer of the second dopant type in electrical contact with the buried layer; forming a well of the first dopant type in the substrate and in contact with the anode; and forming at least one diffusion region comprising the second dopant type in the well.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to high-voltage electrostatic discharge (ESD) devices and methods of manufacture. More specifically, in exemplary embodiments, the high-voltage ESD device(s) comprises a vertical silicon-controlled rectifier (SCR) combined with a vertical NPN device. In embodiments, the SCR and NPN each includes an n+ buried layer (NBL), which is split by a p+ isolation region. Advantageously, the high-voltage ESD device provides high current performance for high-voltage applications, with relatively high holding voltage for high-voltage applications while keeping high current performance. In addition, the high-voltage ESD devices described herein save significant chip area compared to a structure with an equivalent performance.

In embodiments, the ESD device may be a combination of a vertical SCR and vertical NPN (or PNP) to provide a high voltage and high current performance ESD device. The SCR and NPN may be connected through a buried n+ layer (NBL) split by a p+ isolation region. In embodiments, the NBL and p+ isolation region will form a lateral NPN device. Also, the addition of the p+ isolation region will enable a high holding voltage due to an increase in resistance.

In embodiments, the vertical NPN comprises a collector (n+ region), a base (p-type well) and an emitter (n+ diffusion) at the cathode region; whereas the SCR may include a p-field junction at a bottom of a n-type high voltage double diffusion drain (HVNDDD) for a high voltage device at the anode region. A base resistor can also be provided on the cathode side of the device, tapping to the p-well and which provides for fast triggering.

The ESD devices of the present disclosure can be manufactured in a number of ways using a number of different tools. In general, though, the methodologies and tools are used to form structures with dimensions in the micrometer and nanometer scale. The methodologies, i.e., technologies, employed to manufacture the ESD devices of the present disclosure have been adopted from integrated circuit (IC) technology. For example, the structures are built on wafers and are realized in films of material patterned by photolithographic processes on the top of a wafer. In particular, the fabrication of the ESD devices uses three basic building blocks: (i) deposition of thin films of material on a substrate, (ii) applying a patterned mask on top of the films by photolithographic imaging, and (iii) etching the films selectively to the mask.

Figure 1A:
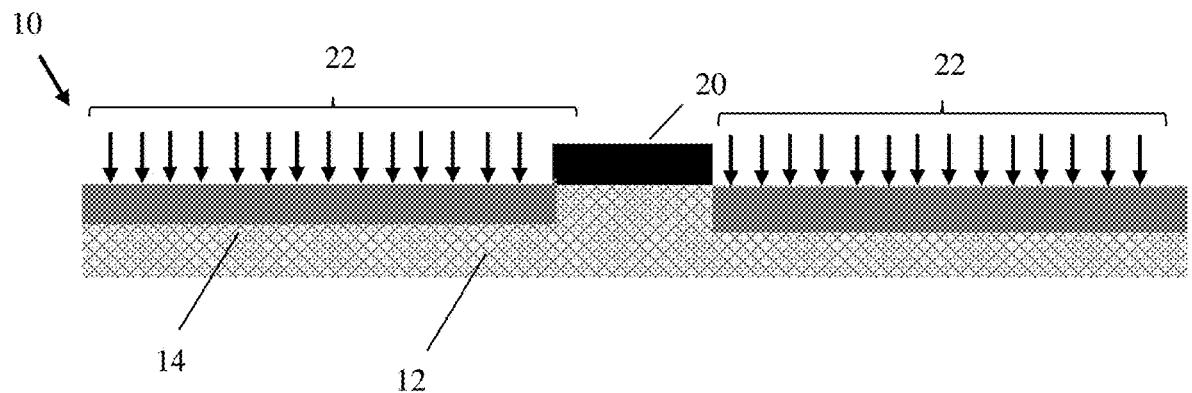
FIGS. 1A-1F show intermediate structures and a final structure comprising a high-voltage electrostatic discharge (ESD) device and respective fabrication processes in accordance with aspects of the present disclosure.

FIGS. 1A-1F show intermediate structures and a final structure of a high-voltage ESD device and respective fabrication processes in accordance with aspects of the present disclosure. In particular, FIG. 1A shows a structure 10 comprising a substrate 12. In embodiments, the substrate 12 may be a p+ substrate composed of any suitable semiconductor material including, but not limited to, Si, SiGe, SiGeC, SiC, GaAs, InAs, InP, and other III/V or II/VI compound semiconductors.

The substrate 12 includes n+ regions 14, e.g., discontinuous n+ regions. In embodiments, the n+ regions 14 may be formed by introducing a dopant by, for example, using an ion implantation process as shown representatively by arrows 22. In embodiments, the n+ regions 14 may be a discontinuous layer of n+ doped material (separated or split by isolation regions as discussed with respect to FIG. 1B). In the ion implantation process, the n+ regions 14 may be formed by introducing a concentration of a dopant of n+ dopant type in the substrate 12 using a patterned implantation mask 20 to define selected areas exposed for the implantation. The n-type dopants used in the n+ regions 14 may include, e.g., Arsenic (As), Phosphorus (P) and Sb, among other suitable examples, at a dopant dose concentration of approximately $1E18$ $cm^{-3}$ to $5E20$ $cm^{-3}$.

The implantation mask 20 may include a layer of a light-sensitive material, such as an organic photoresist, applied by a spin coating process, pre-baked, exposed to light projected through a photomask, baked after exposure, and developed with a chemical developer. The implantation mask 20 has a thickness and stopping power sufficient to block masked areas against receiving a dose of the implanted ions.

Figure 1B:
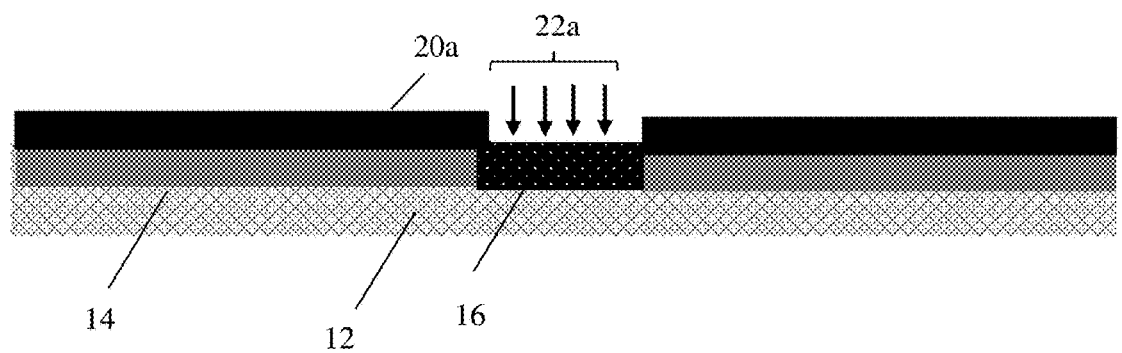

In FIG. 1B, the implantation mask 20 is stripped and another implantation mask 20a may be deposited and patterned to define selected areas exposed for the implantation of p+ dopants for isolation region 16. In embodiments, the isolation region 16 will split or separate adjacent n+ regions 14. The isolation region 16 may be doped with p-type dopants, e.g., Boron (B), among other suitable examples, as shown representatively at arrows 22a. The dopant dose concentration may be approximately $1E18$ $cm^{-3}$ to $5E20$ $cm^{-3}$. In embodiments, the isolation region 16 provides an isolation region between the adjacent n+ regions 14, which can be used to effectively increase the resistance of the device.

Figure 1C:
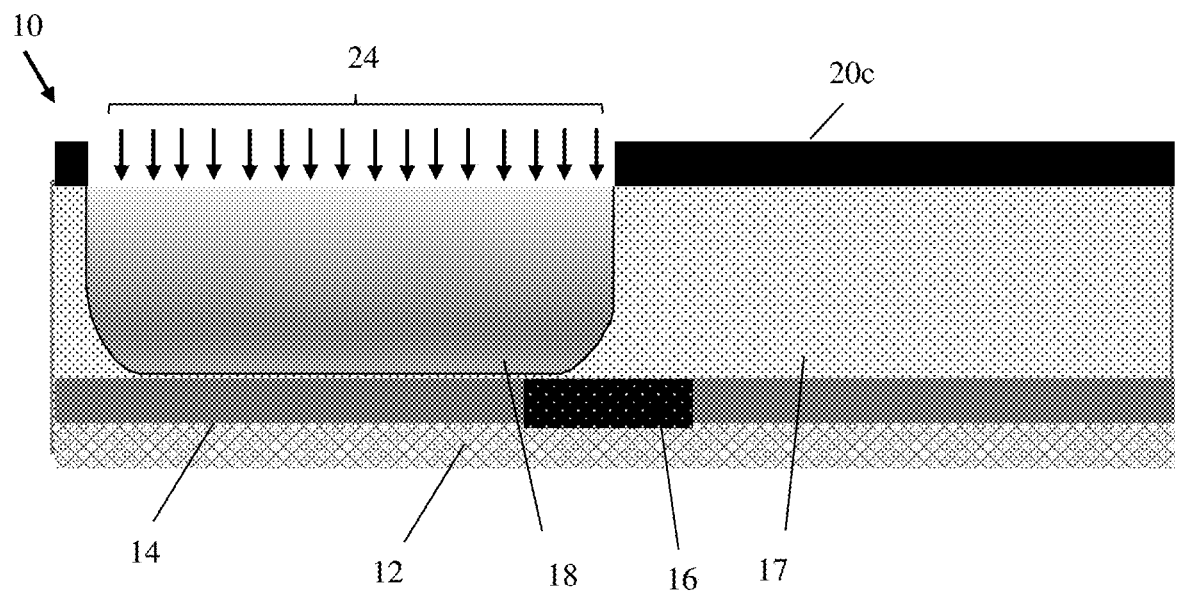

In FIG. 1C, an epitaxial semiconductor material 17 may be grown on the substrate 12 and, more specifically, over the n+ regions 14 and the isolation region 16. In embodiments, the epitaxial semiconductor material 17 may be an n+ type semiconductor material which buries the n+ regions 12 and isolation region 16 within the substrate material, e.g., semiconductor material 12, 17. In alternative embodiments, the substrate 12 may be thicker so that the upper portion may undergo an ion implantation process with an n+ type dopant, e.g., at a concentration of approximately $1E15$ $cm^{-3}$ to $5E17$ $cm^{-3}$. In either scenario, the semiconductor material 17 may be used for n-well and p-well structures as described in more detail herein.

A p-well 18 may be formed within the semiconductor material 17, which is in electrical contact with the n+ region 14 (hereinafter referred to as an n+ buried layer (NBL)). In embodiments, the p-well 18 is a high-voltage p-well formed using p-type dopants, e.g., Boron (B). As with any of the well regions described herein, the high-voltage p-well 18 may be formed by deposition of an implantation mask 20c (similar to the mask described above), followed by a patterning process to form an opening and, thereafter, an ion implantation process of certain dopant type, e.g., p-type dopant for the p-wells, shown representatively by arrows 24, e.g., at a concentration of approximately $4E16$ $cm^{-3}$ to $2E18$ $cm^{-3}$.

Figure 1D:
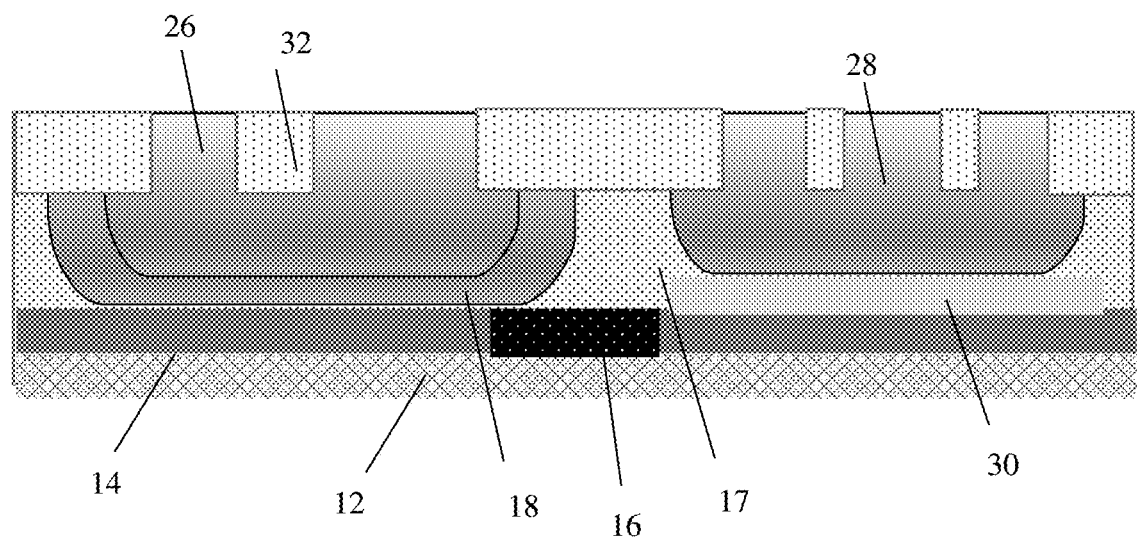

Referring to FIG. 1D, a p-well 26 may be formed in the p-well 18. In embodiments, the p-well 26 may be a p-type high-voltage double diffusion drain (HVPDDD), formed using an ion implantation process with an appropriate implantation mask as already described herein such that no further explanation is required for a complete understanding of the present disclosure. In embodiments, the p-well 18 may have a dopant dose concentration of, e.g., approximately $1E16$ $cm^{-3}$ to $4E18$ $cm^{-3}$.

An n-well 28 may be formed in the substrate 17, remote from the p-wells 18, 26. In other words, the n-well 28 may be separated from the p-wells 18, 26 by the substrate 17. In embodiments, the n-well 28 may be an n-type high-voltage double diffusion drain (HVNDDD) formed by using an ion implantation process with an appropriate implantation mask as already described herein. In embodiments, the n-well 28 may have lower dopant dose concentration to control breakdown voltage, e.g., of approximately $5E15$ $cm^{-3}$ to $4E18$ $cm^{-3}$.

A p-buried layer 30 may be formed below the n-well 28. In embodiments, the p-buried layer 30 makes contact (e.g., electrical contact) to both the NBL 14 and the n-well 28. The p-buried layer 30 may be formed using an ion implantation process with a dopant dose concentration of, e.g., approximately $1E16$ $cm^{-3}$ to $1E19$ $cm^{-3}$.

FIG. 1D shows shallow trench isolation structures 32 formed in the wells 26, 28 and spanning between the wells 26, 28. The shallow trench isolation structures 32 can be formed by conventional lithography, etching and deposition methods known to those of skill in the art. For example, a resist formed over the substrate 17 is exposed to energy (light) to form a pattern (opening). An etching process with a selective chemistry, e.g., reactive ion etching (RIE), will be used to form one or more trenches in the substrate 17 through the openings of the resist. Following the resist removal by a conventional oxygen ashing process or other known stripants, insulator material, e.g., oxide, can be deposited in the trenches by any conventional deposition processes, e.g., chemical vapor deposition (CVD) process, to form the shallow trench isolation structures 32. Any residual insulator material on the surface of the substrate 17 can be removed by conventional chemical mechanical polishing (CMP) processes.

In embodiments, the lateral dimension of the shallow trench isolation region spanning between the wells 34, 36 may be adjusted to provide a high DC breakdown voltage and prevention of a lateral SCR. Also, in embodiments, the shallow trench isolation structures 32 can be replaced by LOCOS (LOCal Oxidation of Silicon).

Figure 1E:
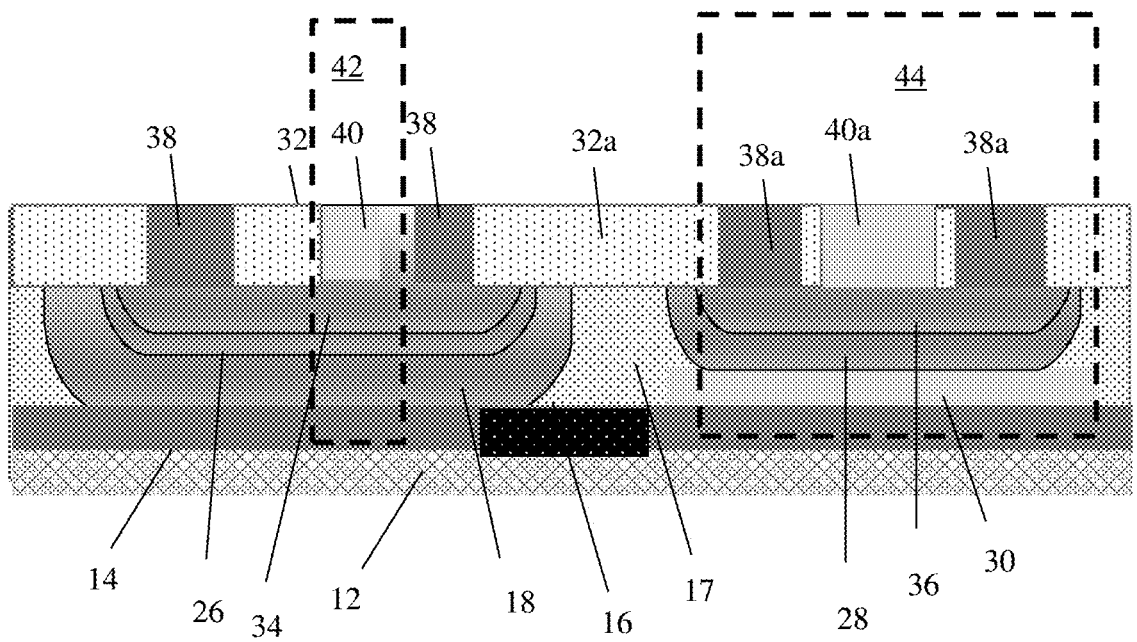

In FIG. 1E, a p-well 34 and an n-well 36 may be formed in the substrate 17. More specifically, the p-well 34 may be formed in the p-well 26 and the n-well 36 may formed in the n-well 28. Again, the wells 34, 36 may be formed by conventional ion implantation processes with appropriate dopant types at a dopant dose concentration of, e.g., approximately $1E17$ $cm^{-3}$ to $1E19$ $cm^{-3}$.

In addition, p+ doped region 38 and n+ doped region 40 may be formed in the p-well 34; whereas p+ doped regions 38a and n+ doped region 40a may be formed in the n-well 36 using respective p-type dopants and n-type dopants. In embodiments, the doped region 40 may be an emitter region. Also, the combination of the p-well 34, p-well 26 and p-well 18 may be a p-type base region. The p+ doped region 38 and n+ doped region 40 may be doped at a higher dopant concentration, e.g., $5E19$ $cm^{-3}$ to $5E21$ $cm^{-3}$. The structure may undergo a thermal process (e.g., rapid thermal process) for dopant activation and diffusion.

In embodiments, the shallow trench isolation structures 32 located in the n-well 36 may be provided between the well regions 38a and 40a. As should be understood by those of skill in the art, the shallow trench isolation structures 32 may reduce current voltage, which result in a faster turn on of the device. In addition, shallow trench isolation structure (or LOCOS) 32a is provided between and separates the different wells 34, 36.

It should be recognized that the combination of regions 40, 34, 26, 14, 18 form a vertical NPN device 42. Also, the combination of regions 38a, 40a, 36, 28, 30 and 14 form a vertical PNPN silicon-controlled rectifier (SCR) device 44. In embodiments, the NPN device 42 and the PNPN SCR device 44 are separated by the shallow trench isolation region (or LOCOS) 32a. In embodiments, the space between the isolation region 32a may be large, e.g., approximately 4 to 10 µm or larger, to provide a high DC breakdown voltage and prevention of a lateral SCR. In embodiments, the lateral SCR can lead to high density of current flow due to a narrow current path.

Also, the NPN region 42 may be on a cathode side of the device; whereas the PNPN SCR 44 may be on the anode side of the device. Moreover, both of these devices 42, 44 will be electrically connected together through the NBL 14 and isolation region 16, e.g., collector. And, by using the p-buried layer 30, the PNPN SCR 44 can have a current performance of approximately 80 mA/um, which is a relatively high current to provide improved performance and high holding voltage (Vh) compared to a conventional high voltage NPN SCR. In addition, by increasing the distance between the wells 34, 36, it is also possible to control voltage breakdown.

Figure 1F:
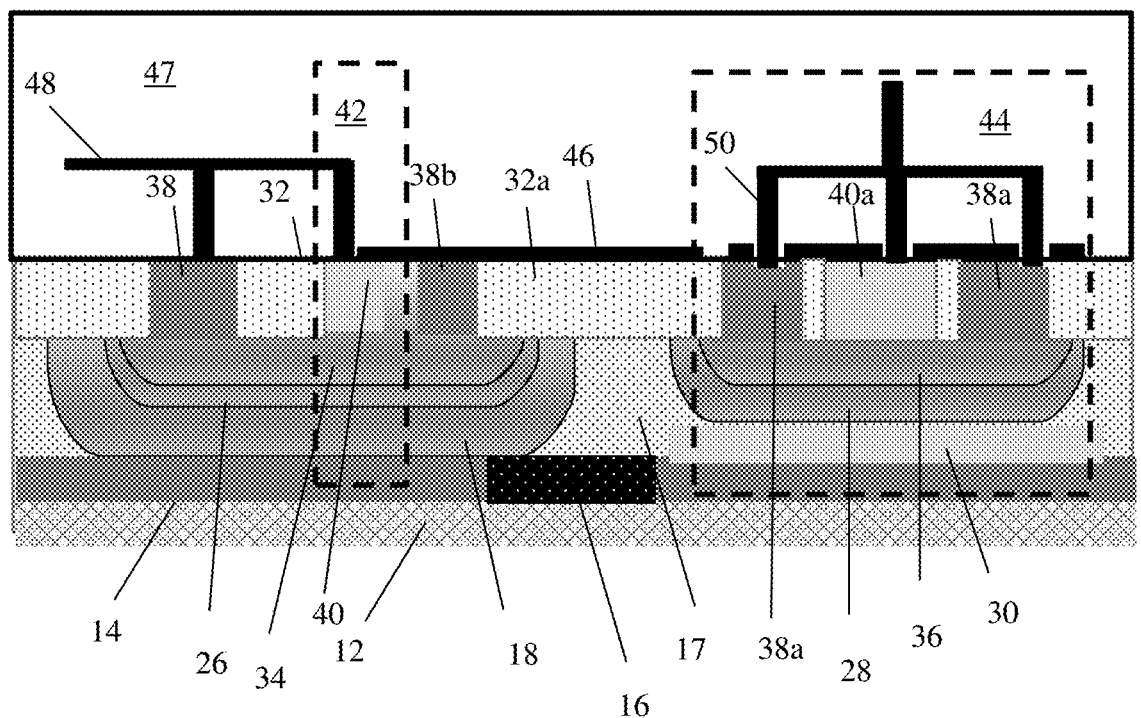

As further shown in FIG. 1F, a cathode 48 connects to the NPN device 42 and an anode 50 connects to the PNPN SCR device 44. Prior to forming contacts of the cathode 48 and anode 50, a silicide block layer 46 may be formed over portions of the structure including, e.g., completely blocking the p+ doped region 38b of the NPN device 42. A silicide process may then be performed to form silicide on the remaining active regions 38, 38a, 40 and 40a. The contacts of the cathode 48 and anode 50 are composed of metal contacts.

As should be understood by those of skill in the art, the silicide process begins with deposition of a thin transition metal layer, e.g., nickel, cobalt or titanium, over fully formed and patterned devices (e.g., doped or ion implanted regions 38, 38a, 40, 40a). After deposition of the material, the structure is heated allowing the transition metal to react with exposed silicon (or other semiconductor material as described herein) in the active regions of the device (e.g., doped or ion implanted regions 38, 38a, 40, 40a) forming a low-resistance transition metal silicide. Following the reaction, any remaining transition metal is removed by chemical etching, leaving silicide contacts in the active regions of the device. The non-silicided p+ doped region 38b will be a floating p-type region between the cathode 48 and the shallow trench isolation region 32a, adjacent to the anode 50. The dimensions (e.g., width) of the floating p-type region can be adjusted for preventing a lateral SCR making current flow in a vertical direction through the PNPN and NPN. In embodiments, the mask to prevent the p+ doped region 38b from being silicide will prevent the formation of a lateral SCR for high voltage (Vh) control. Also, by adjusting the width of the p+ doped region 38b, it is possible to prevent lateral SCR action, make current flow in the vertical direction through the PNPN and NPN portions of the device, and hence increase holding voltage.

Following the silicide process, an insulator material 47 may be formed over the structure using a conventional deposition process of oxide material, e.g., chemical vapor deposition (CVD) processes. The insulator material 47 undergoes a conventional etching (RIE) process to form openings exposing the silicide of the regions 38, 40, 38a, 40a. Thereafter, contact metal(s), e.g., aluminum, tungsten, etc., may be deposited within openings of the insulator material 47 to form the contacts for the cathode 48 and the anode 50. In embodiments, the contacts of the cathode 48 are in direct contact with the doped regions 38, 40 and the contacts of the anode 50 are in direct contact with doped regions 38a, 40a.

Figure 2:
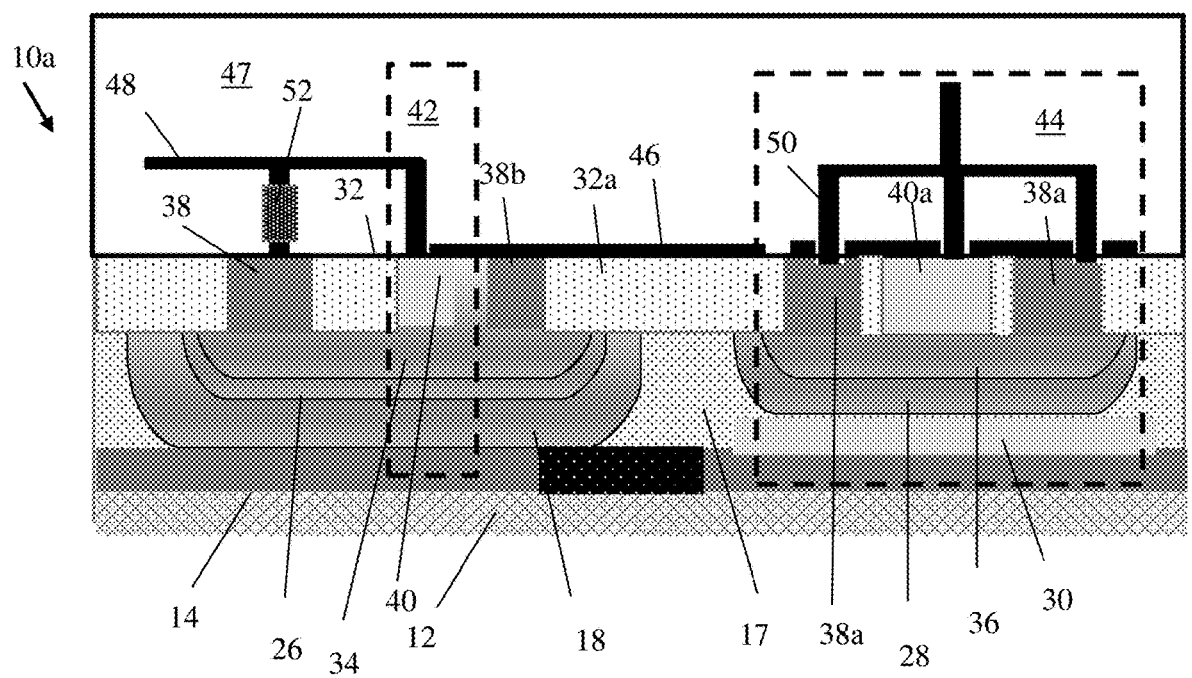
FIG. 2 shows an ESD device in accordance with additional aspects of the present disclosure.

FIG. 2 shows an ESD device in accordance with additional aspects of the present disclosure. In particular, the ESD device 10a of FIG. 2 includes a resistor 52 on the contact of the cathode 48. For example, the resistor 52 may be provided on the contact plug for the p+ region 38. In embodiments, the resistor 52 may be a base resistor with a resistance of, e.g., 10 kohm, which enables fast triggering.

Figure 3:
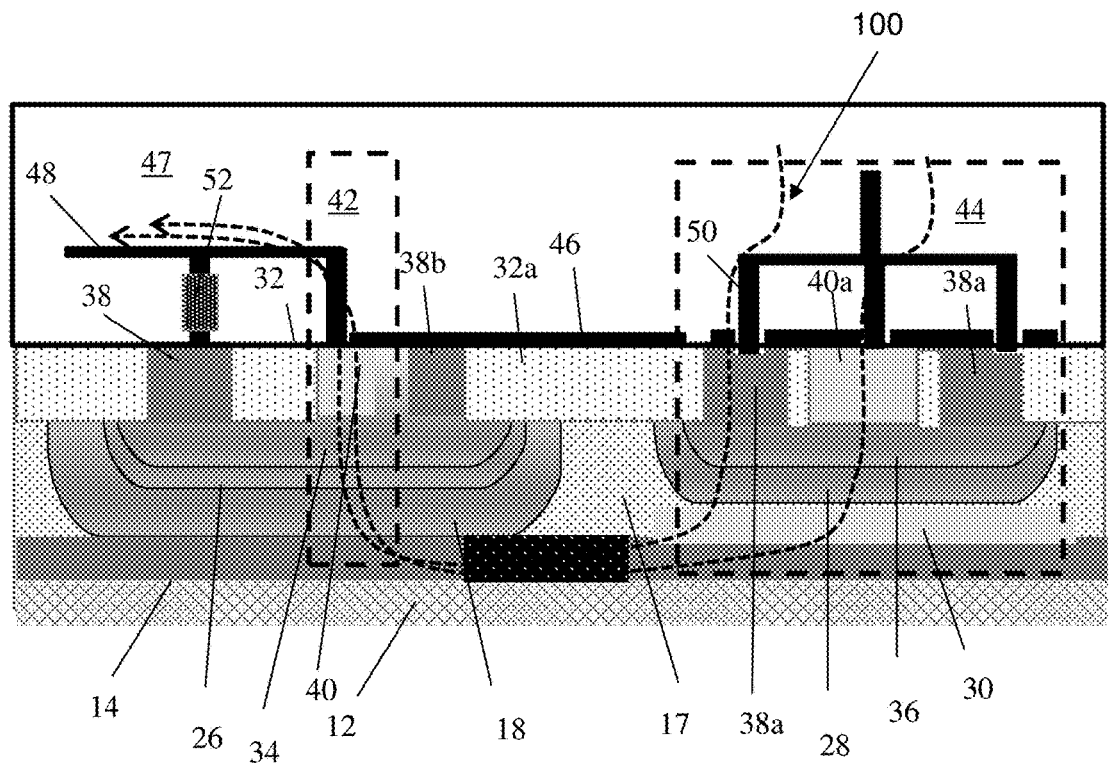
FIG. 3 representatively shows an electrical current flow through the ESD device of FIG. 2.

FIG. 3 representatively shows electrical current flows through the device of FIG. 2. In particular, the electric current flow is representative shown by the dashed arrows, as it passes from the anode side of the device to the cathode side of the device. In embodiments, the current flow labeled 100 is a major current path. The current flow will be through both the PNPN SCR device 44 and NPN device 42, by having the current passing through the NBL 14 and isolation region 16. It should be recognized by those of ordinary skill in the art that the current flow will be similar in any of the devices described herein, e.g., from the anode of the side of the PNPN SCR device through the NBL 14 and isolation region 16, to the cathode on the side of the NPN device. It should also be understood by those of skill in the art that the isolation region 16 will provide an increased resistance of the device to effectively enable a high holding voltage.

Figure 4:
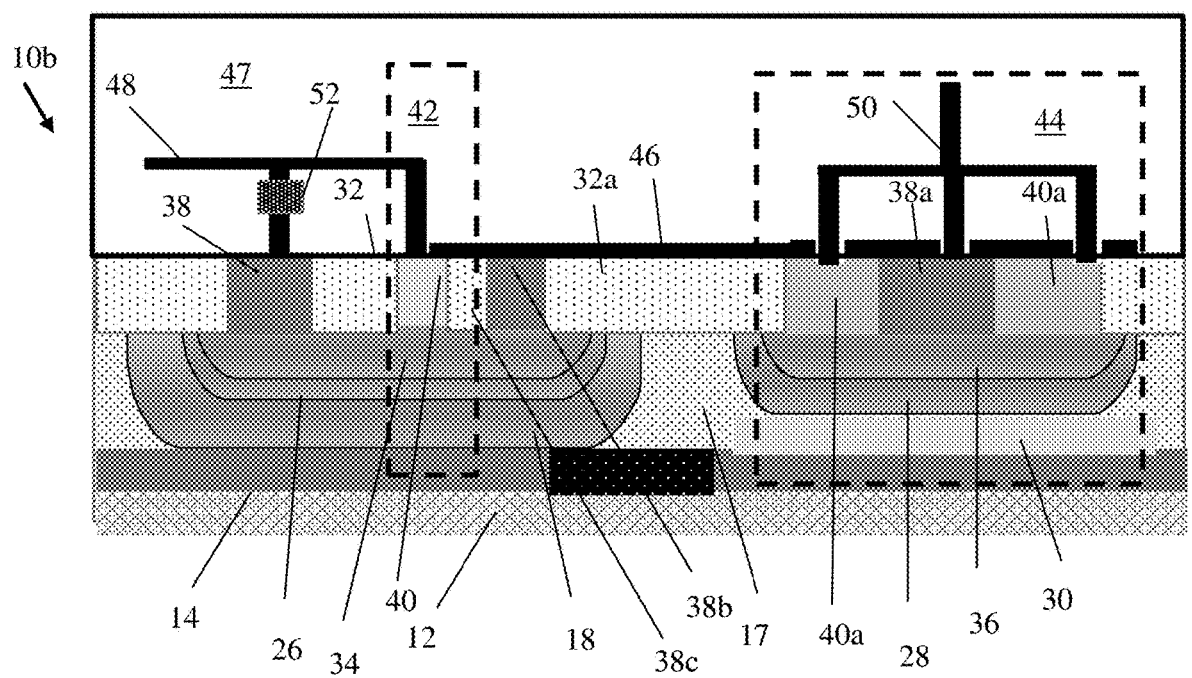
FIGS. 4-7 show differently configured ESD devices in accordance with additional aspects of the present disclosure.

FIG. 4 shows an ESD device in accordance with further aspects of the present disclosure. In the ESD device 10b of FIG. 4, the p+ region 38a is provided between the n+ regions 40a within the well region 36 on the side of the anode 50. In this way, the p+ region 38a is in the middle of two n+ regions 40a. The shallow isolation structures in the well 36 (e.g., between the p+ region 38a and the n+ regions 40a) can also be removed in this configuration. The remaining features are the same as with respect to FIG. 1E or 2.

Figure 5:
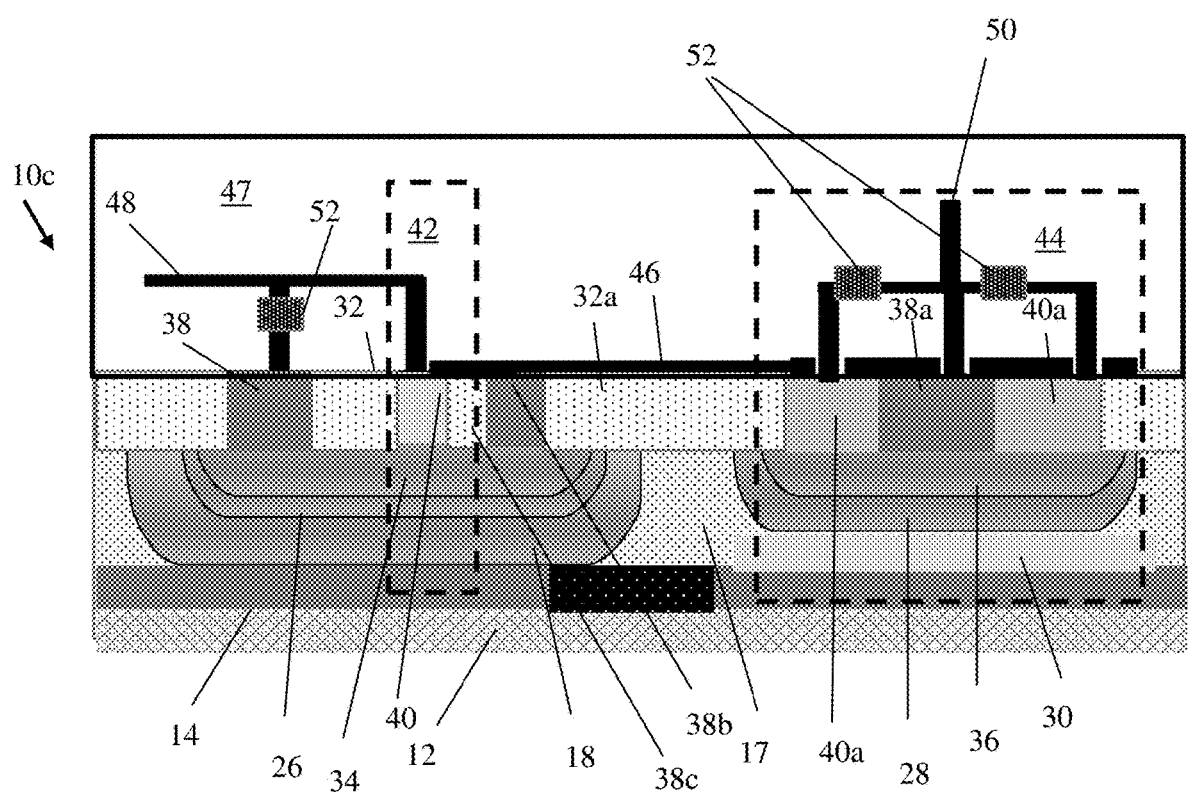

FIG. 5 shows an ESD device in accordance with further aspects of the present disclosure. In the ESD device 10c of FIG. 5, resistors 52 are provided on contacts for the anode side of the device. In embodiments, the resistors 52 may be base resistors with a resistance of, e.g., 1 kohm, for providing fast triggering and keeping the DC breakdown voltage high. The remaining features are the same as with respect to FIG. 4.

Figure 6:
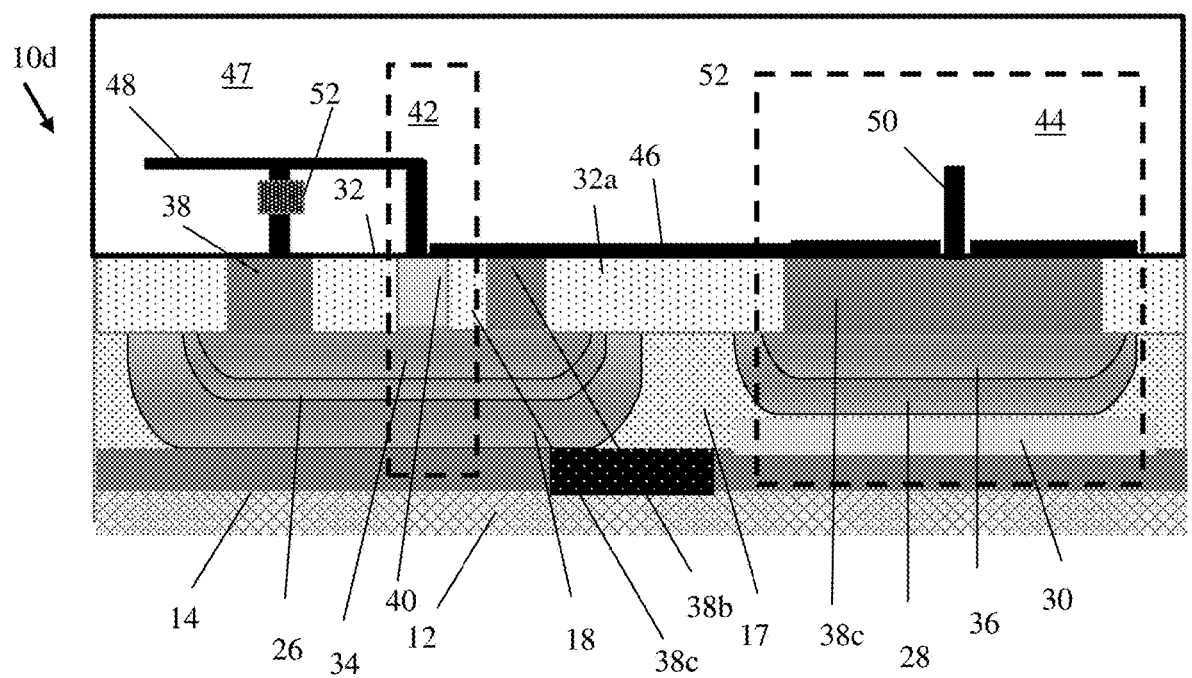

FIG. 6 shows yet another ESD device in accordance with aspects of the present disclosure. In the ESD device 10d of FIG. 6, a single p+ region 38c may be provided within the n-well region 36. The single p+ region 38c may be connected to the anode 50. Also, as should be recognized by one of ordinary skill in the art, the single p+ region 38c will undergo a silicide process in the area of the connection to the anode 50; otherwise, the silicide block layer 46 will remain over the remaining portions thereof. The remaining features are the same as with respect to FIG. 4.

Figure 7:
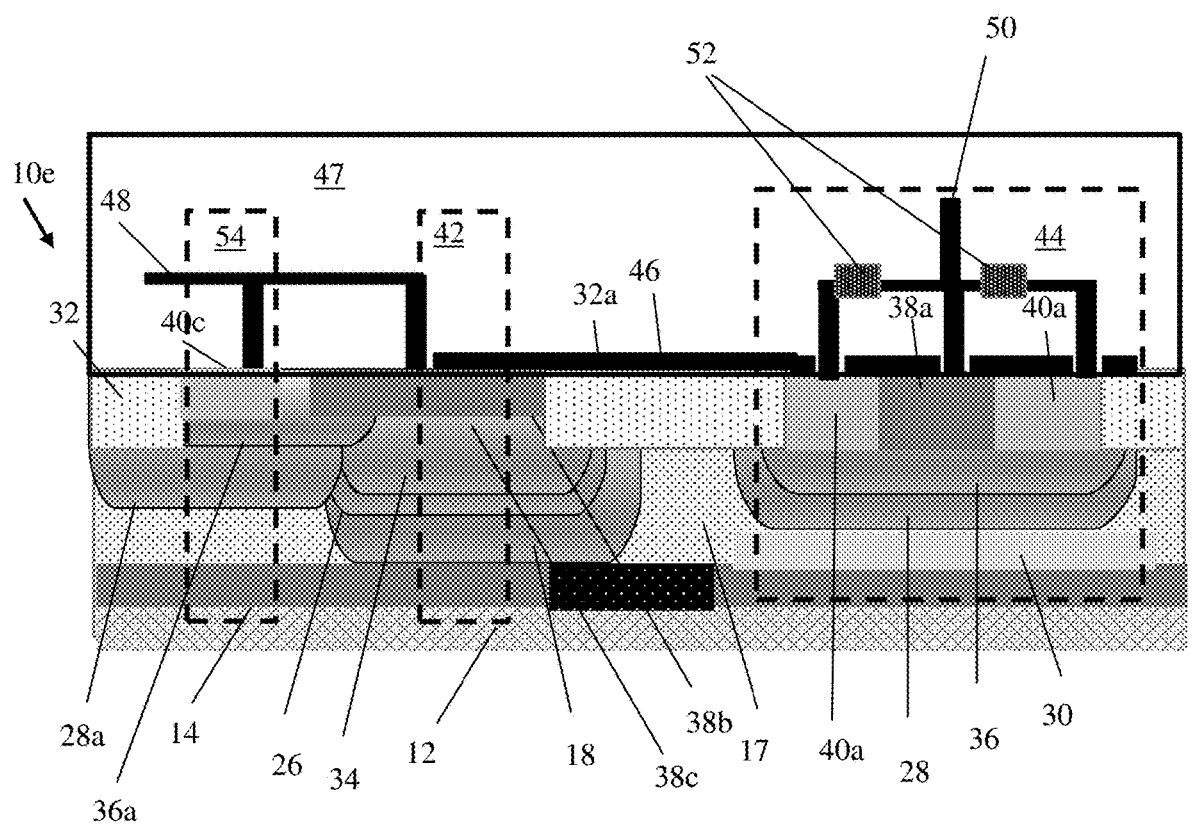

FIG. 7 shows another ESD device in accordance with aspects of the present disclosure. In the ESD device 10e of FIG. 7, a vertical resistor 54 formed in the substrate, e.g., semiconductor material 12, 17, may be provided on a cathode side of the device. In this embodiment, the vertical resistor 54 may comprise an n-well 28a formed in the substrate 17, adjacent to the p-wells 18, 26, in addition to an n-well 36a formed in the n-well 28a. In embodiments, the wells 28a, 36a may directly contact at least the well 34. It should be understood by those of ordinary skill in the art that the n-wells 28a, 36a may be formed in the same processes (e.g., using the same blocking masks and ion implantation processes) as the wells 28, 36. An n+ doped region 40c may be formed in the n-well 36a. In this way, the vertical resistor 54 comprises the n+ doped region 40c, wells 28a, 36a and the NBL 14. The remaining features are the same as with respect to FIG. 4, including the SCR 44, the NPN device 42 and the lateral NPN, e.g., comprising regions 14, 16.

The ESD devices can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a vertical silicon-controlled rectifier (SCR) connecting to an anode, which comprises a buried layer of a first dopant type in electrical contact with an underlying buried layer comprising a second dopant type split with an isolation region of the first dopant type within a substrate.

2. The structure of claim 1, wherein the first dopant type comprises a p-type dopant and the second dopant type comprises an n-type dopant.

3. The structure of claim 2, wherein the underlying buried layer extends to a vertical NPN device connecting to a cathode and which comprises a p-type base, an n-type emitter and the underlying buried layer comprising the second dopant type.

4. The structure of claim 3, further comprising a base resistor connected between the vertical NPN device and the cathode.

5. The structure of claim 3, further comprising a vertical resistor adjacent to the vertical NPN device, the vertical resistor comprising an n+ diffusion region within an n-well and electrically connected to the underlying buried layer.

6. The structure of claim 2, wherein the vertical NPN device includes a floating p+ region within a p-well of the vertical NPN device.

7. The structure of claim 1, wherein the vertical SCR comprises a vertical PNPN SCR comprising p+ doped regions and an n+ doped region within at least one n-well.

8. The structure of claim 7, further comprising base resistors between the at least one n-well and the anode.

9. The structure of claim 7, wherein the vertical SCR comprises p+ regions and an n+ region between the p+ regions, and wherein the p+ regions are separated from the n+ region by shallow trench isolation structures.

10. The structure of claim 1, wherein the vertical SCR comprises a single p+ region within an n-well, the single p+ region connected to the anode.

11. A structure comprising a vertical NPN in a substrate and connected to a cathode, the vertical NPN comprising a buried layer of a first dopant type electrically contacting an isolation region of a different dopant type, a base of a second dopant type and an emitter of the first dopant type.

12. The structure of claim 11, wherein the first dopant type comprises an n-type dopant, the second dopant type comprises a p-type dopant and the different dopant type comprises the p-type dopant.

13. The structure of claim 11, further comprising a vertical silicon-controlled rectifier (SCR) which shares the buried layer with the vertical NPN, and with the isolation region of the different dopant type between the vertical SCR and the vertical NPN.

14. The structure of claim 13, further comprising an isolation structure between and separating the vertical SCR and the vertical NPN.

15. The structure of claim 13, wherein the vertical SCR comprises a vertical PNPN SCR.

16. The structure of claim 13, further comprising a vertical resistor adjacent to the vertical NPN.

17. The structure of claim 16, wherein wells of the vertical resistor directly contacts wells of the vertical NPN.

18. The structure of claim 16, wherein the vertical resistor comprises an n+ diffusion region within an n-well and electrically connected to the first dopant type of the buried layer.

19. The structure of claim 13, wherein the vertical SCR comprises n+ dopant and p+ dopant regions.

20. A method comprising:
    forming a vertical silicon-controlled rectifier (SCR) in a substrate and connecting to an anode, the forming of the vertical SCR comprising:
        forming a buried layer in the substrate, the buried layer comprising forming a first dopant type layer and an isolation region of a second dopant type that splits the first dopant type layer;
        forming a buried layer of the second dopant type in electrical contact with the buried layer;
        forming a well of the first dopant type in the substrate and in contact with the anode; and
        forming at least one diffusion region comprising the second dopant type in the well.

* * * * *